US012621956B2

(12) United States Patent

Tunks et al.

(10) Patent No.: US 12,621,956 B2

(45) Date of Patent: May 5, 2026

(54) ACOUSTICALLY-SENSITIVE FILTER FOULING TESTS

(71) Applicant: Dell Products L.P., Round Rock, TX (US)

(72) Inventors: Eric Tunks, Austin, TX (US); Donnie W. Gerhart, Leander, TX (US); Seth Law, Oxford (GB)

(73) Assignee: Dell Products L.P., Round Rock, TX (US)

( * ) Notice: Subject to any disclaimer, the term of this patent is extended or adjusted under 35 U.S.C. 154(b) by 202 days.

(21) Appl. No.: 17/863,543

(22) Filed: Jul. 13, 2022

(65) Prior Publication Data

US 2024/0023273 A1     Jan. 18, 2024

(51) Int. Cl.
*G01N 15/08* (2006.01)
*H05K 7/20* (2006.01)

(52) U.S. Cl.
CPC ..... *H05K 7/20209* (2013.01); *G01N 15/0826* (2013.01); *G01N 2015/084* (2013.01)

(58) Field of Classification Search
None
See application file for complete search history.

(56) References Cited

U.S. PATENT DOCUMENTS 6,319,114 B1 * 11/2001 Nair ................... H05K 7/20181
                                                96/420
6,448,896 B1     9/2002 Bankus

| 9,186,609 B2 * | 11/2015 | Sherman, III ..... B01D 46/0086 |
| 10,146,190 B2 | 12/2018 | Lovicott et al. |
| 11,350,543 B2 | 5/2022 | Shabbir et al. |
| 11,543,147 B1 * | 1/2023 | Rite ......................... F24F 11/49 |
| 2002/0066372 A1 | 6/2002 | White |
| 2005/0247194 A1 | 11/2005 | Kang |
| 2006/0100796 A1 | 5/2006 | Fraden |
| 2008/0198896 A1 * | 8/2008 | Nair .................. H05K 7/20736 |
| | | 374/E13.006 |
| 2013/0288585 A1 * | 10/2013 | Hoke ................... B60H 3/0616 |
| | | 454/75 |
| 2013/0325368 A1 | 12/2013 | Robb |
| 2014/0083292 A1 | 3/2014 | Weiden |
| 2015/0241934 A1 * | 8/2015 | Balogh ..................... G01P 5/06 |
| | | 73/861.85 |
| 2015/0306533 A1 | 10/2015 | Matlin |
| 2024/0219052 A1 * | 7/2024 | Sellö ...................... F24F 13/24 |

* cited by examiner

*Primary Examiner* — Alexander A Mercado

(74) *Attorney, Agent, or Firm* — Jackson Walker L.L.P.

(57) ABSTRACT

A method may include, during a filter fouling test of an air filter, determining if the air mover is operating below a first predetermined filter testing speed, in response to the air mover operating below the first predetermined filter testing speed, operating the air mover at the first predetermined filter testing speed and determining an indicator of filter degradation of the air filter responsive to the first predetermined filter testing speed, in response to the air mover operating above the first predetermined filter testing speed, operating the air mover at a second predetermined filter testing speed significantly greater than the first predetermined filter testing speed and determining the indicator of filter degradation of the air filter responsive to the second predetermined filter testing speed, and determining if the indicator of filter degradation is below a respective filter failure threshold.

9 Claims, 4 Drawing Sheets

102

202

204

206

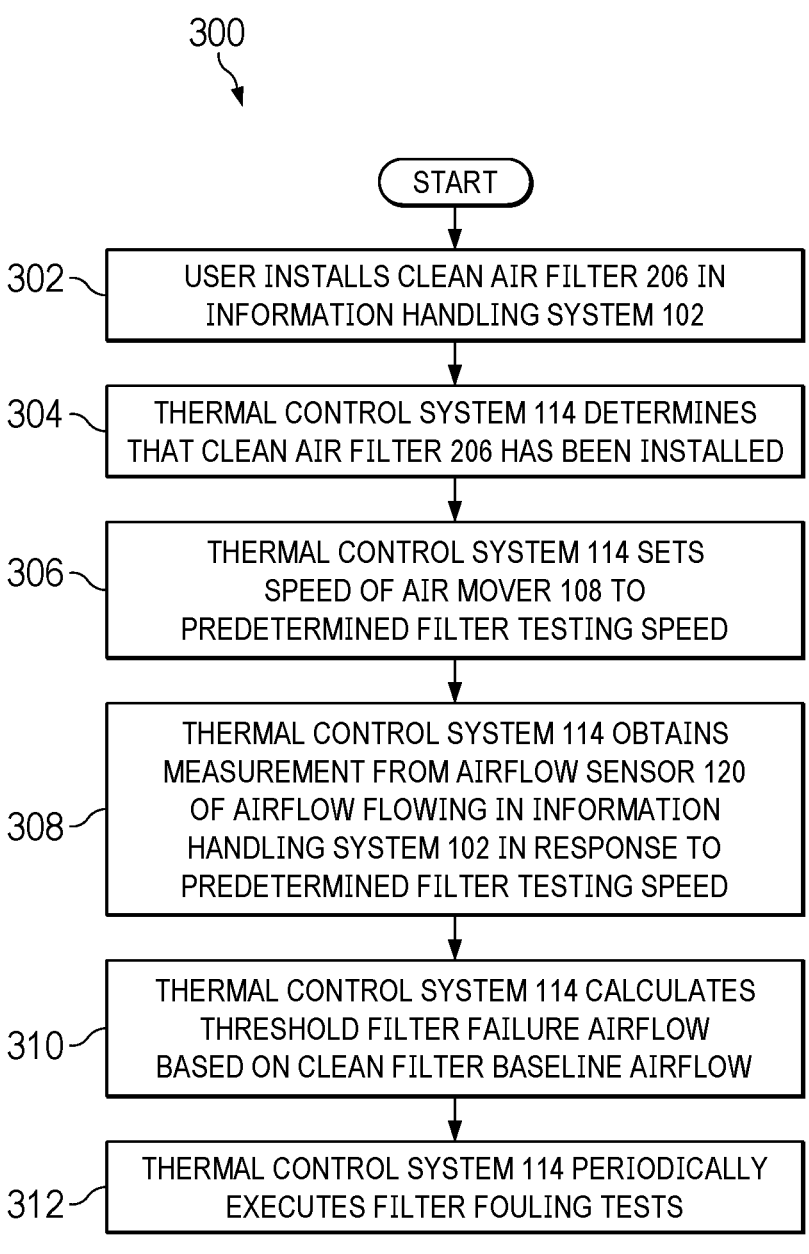

300

START

302 — USER INSTALLS CLEAN AIR FILTER 206 IN INFORMATION HANDLING SYSTEM 102

304 — THERMAL CONTROL SYSTEM 114 DETERMINES THAT CLEAN AIR FILTER 206 HAS BEEN INSTALLED

306 — THERMAL CONTROL SYSTEM 114 SETS SPEED OF AIR MOVER 108 TO PREDETERMINED FILTER TESTING SPEED

308 — THERMAL CONTROL SYSTEM 114 OBTAINS MEASUREMENT FROM AIRFLOW SENSOR 120 OF AIRFLOW FLOWING IN INFORMATION HANDLING SYSTEM 102 IN RESPONSE TO PREDETERMINED FILTER TESTING SPEED

310 — THERMAL CONTROL SYSTEM 114 CALCULATES THRESHOLD FILTER FAILURE AIRFLOW BASED ON CLEAN FILTER BASELINE AIRFLOW

312 — THERMAL CONTROL SYSTEM 114 PERIODICALLY EXECUTES FILTER FOULING TESTS

FIG. 3

ACOUSTICALLY-SENSITIVE FILTER FOULING TESTS

TECHNICAL FIELD

The present disclosure relates in general to information handling systems, and more particularly to detecting fouling of an air filter in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

In some instances, information handling systems may be deployed into locations with poor air quality. As such, such information handling systems are often equipped with integrated filters (e.g., integrated within a bezel of the information handling system chassis) to prevent airborne particulates from entering such information handling systems. However, as a filter accumulates particulates, airflow impedance may increase, rendering it more difficult for air movers to draw in airflow. Accordingly, information handling systems with closed-loop thermal control may tend to drive air movers at greater speeds in order to account for this higher airflow impedance. Likewise, in open-loop thermal control systems, less airflow may be driven by air movers to cool components and thus such information handling systems may operate at higher temperatures. In either case, a degraded filter may mean that an information handling system may support lower ambient temperatures than would be the case for a non-degraded filter. Thus, it may be desirable to clean or replace such filters once they reach a certain level of particulate accumulation, in order to prevent such decreased air mover performance.

While existing approaches exist for alerting an administrator or user (e.g., a reminder alert after a fixed period of time), such approaches have disadvantages. For example, a timer-based alert may not account for differences in hardware configurations of information handling systems or for differences between clean and dirty ambient environments.

SUMMARY

In accordance with the teachings of the present disclosure, the disadvantages and problems associated with detecting of filter fouling in an information handling system may be substantially reduced or eliminated.

In accordance with embodiments of the present disclosure, an information handling system may include an information handling resource, an air mover configured to drive air to cool the information handling resource, and a thermal control system for controlling the air mover. The thermal control system may be further configured to, in response to an indication that a clean air filter has been installed in the information handling system set a speed of the air mover to a predetermined filter testing speed, determine a clean filter baseline airflow as an airflow driven within the information handling system responsive to the predetermined filter testing speed, calculate a threshold filter failure airflow based on the clean filter baseline airflow, and periodically execute filter fouling tests. During each filter fouling test, the thermal control system may be configured to set the speed of the air mover to the predetermined filter testing speed, determine a resulting airflow within the information handling system responsive to the predetermined filter testing speed, compare the resulting airflow to the threshold filter failure airflow, and communicate an alert responsive to the resulting airflow being below the threshold filter failure airflow.

In accordance with these and other embodiments of the present disclosure, a method may include, in response to an indication that a clean air filter has been installed in an information handling system, setting a speed of an air mover of the information handling system to a predetermined filter testing speed, determining a clean filter baseline airflow as an airflow driven within the information handling system responsive to the predetermined filter testing speed, calculating a threshold filter failure airflow based on the clean filter baseline airflow, and periodically executing filter fouling tests. Each filter fouling test may include setting the speed of the air mover to the predetermined filter testing speed, determining a resulting airflow within the information handling system responsive to the predetermined filter testing speed, comparing the resulting airflow to the threshold filter failure airflow, and communicating an alert responsive to the resulting airflow being below the threshold filter failure airflow.

In accordance with these and other embodiments of the present disclosure, an article of manufacture may include a non-transitory computer-readable medium and computer-executable instructions carried on the computer-readable medium, the instructions readable by a processing device, the instructions, when read and executed, for causing the processing device to, in response to an indication that a clean air filter has been installed in an information handling system, set a speed of an air mover of the information handling system to a predetermined filter testing speed, determine a clean filter baseline airflow as an airflow driven within the information handling system responsive to the predetermined filter testing speed, calculate a threshold filter failure airflow based on the clean filter baseline airflow, and periodically execute filter fouling tests. Each filter fouling test may include setting the speed of the air mover to the predetermined filter testing speed, determining a resulting airflow within the information handling system responsive to the predetermined filter testing speed, comparing the resulting airflow to the threshold filter failure airflow, and communicating an alert responsive to the resulting airflow being below the threshold filter failure airflow.

In accordance with these and other embodiments of the present disclosure, an information handling system may include an information handling resource, an air mover configured to drive air to cool the information handling resource, and a thermal control system for controlling the air mover and configured to, during a filter fouling test of an air filter of the information handling system, determine if the air mover is operating below a first predetermined filter testing speed, in response to the air mover operating below the first predetermined filter testing speed, operate the air mover at the first predetermined filter testing speed and determine an indicator of filter degradation of the air filter responsive to the first predetermined filter testing speed, in response to the air mover operating above the first predetermined filter testing speed, operate the air mover at a second predetermined filter testing speed significantly greater than the first predetermined filter testing speed and determine the indicator of filter degradation of the air filter responsive to the second predetermined filter testing speed, determine if the indicator of filter degradation is below a respective filter failure threshold based on a predetermined filter testing speed from which the indicator was generated, and communicate an alert responsive to the indicator of filter degradation being below the respective threshold filter failure airflow.

In accordance with these and other embodiments of the present disclosure, a method may include, during a filter fouling test of an air filter of an information handling system, determining if the air mover is operating below a first predetermined filter testing speed, in response to the air mover operating below the first predetermined filter testing speed, operating the air mover at the first predetermined filter testing speed and determining an indicator of filter degradation of the air filter responsive to the first predetermined filter testing speed, in response to the air mover operating above the first predetermined filter testing speed, operating the air mover at a second predetermined filter testing speed significantly greater than the first predetermined filter testing speed and determining the indicator of filter degradation of the air filter responsive to the second predetermined filter testing speed, determining if the indicator of filter degradation is below a respective filter failure threshold based on a predetermined filter testing speed from which the indicator was generated, and communicating an alert responsive to the indicator of filter degradation being below the respective threshold filter failure airflow.

In accordance with these and other embodiments of the present disclosure, an article of manufacture may include a non-transitory computer-readable medium and computer-executable instructions carried on the computer-readable medium, the instructions readable by a processing device, the instructions, when read and executed, for causing the processing device to: determine if the air mover is operating below a first predetermined filter testing speed, in response to the air mover operating below the first predetermined filter testing speed, operate the air mover at the first predetermined filter testing speed and determine an indicator of filter degradation of the air filter responsive to the first predetermined filter testing speed; in response to the air mover operating above the first predetermined filter testing speed, operate the air mover at a second predetermined filter testing speed significantly greater than the first predetermined filter testing speed and determine the indicator of filter degradation of the air filter responsive to the second predetermined filter testing speed; determine if the indicator of filter degradation is below a respective filter failure threshold based on a predetermined filter testing speed from which the indicator was generated; and communicate an alert responsive to the indicator of filter degradation being below the respective threshold filter failure airflow.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates a flow chart of an example method for applying a self-calculating filter fouling threshold, in accordance with embodiments of the present disclosure.

DETAILED DESCRIPTION

Preferred embodiments and their advantages are best understood by reference to FIGS. 1 through 4, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages, electro-mechanical devices (e.g., air movers), displays, and power supplies.

Figure 1:
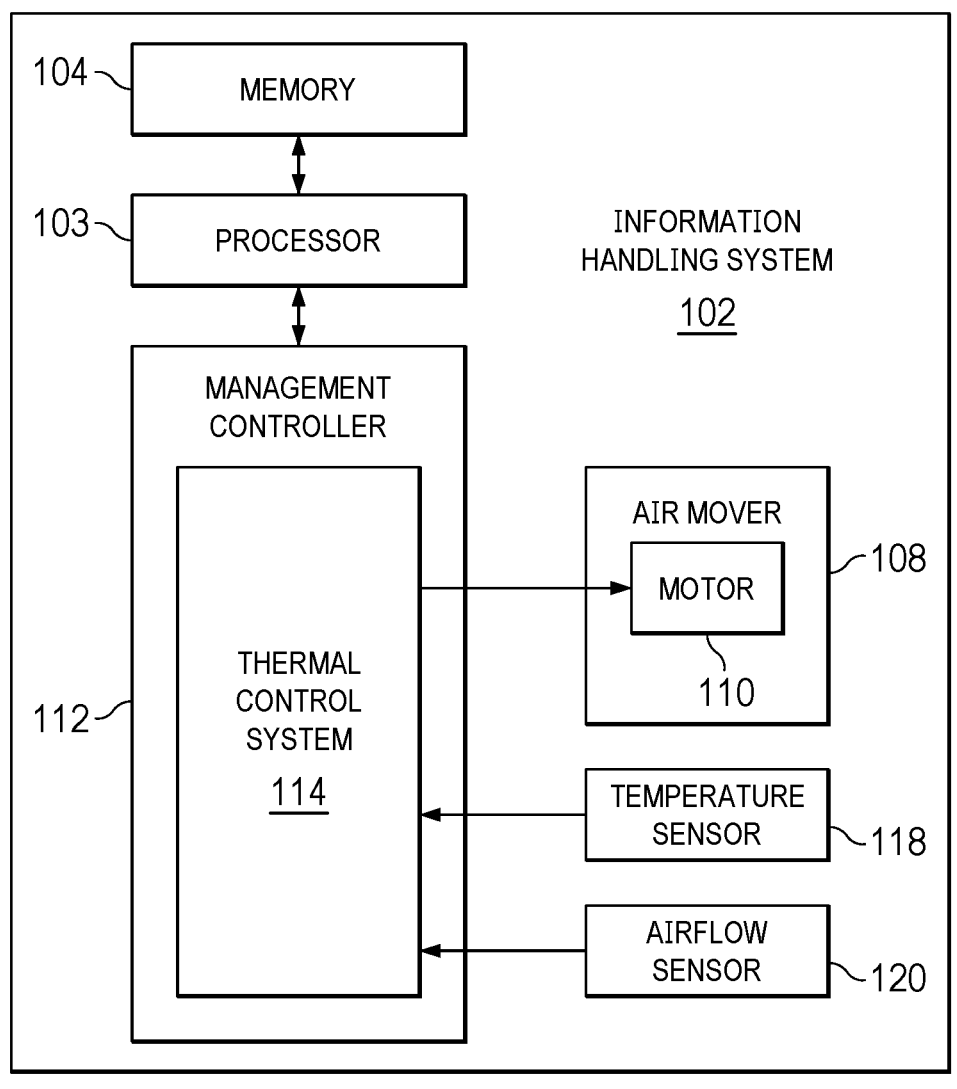
FIG. 1 illustrates a block diagram of selected components of an example information handling system, in accordance with embodiments of the present disclosure.

FIG. 1 illustrates a block diagram of selected components of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may comprise a processor 103, a memory 104, an air mover 108, a management controller 112, a temperature sensor 118, and an airflow sensor 120.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal (e.g., a pulse-width modulation signal) communicated from thermal control system 114 of management controller 112. In operation, air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 118) and based on such one or more signals, calculate an air mover driving signal (e.g., a pulse-width modulation signal) to maintain an appropriate level of cooling, increase cooling, or decrease cooling, as appropriate, and communicate such air mover driving signal to air mover 108. Thermal control for air mover 108 by thermal control system 114 may be performed in any suitable manner, for example, as described in U.S. Pat. No. 10,146, 190 entitled "Systems and Methods for Providing Controller Response Stability in a Closed-Loop System."

In addition, thermal control system 114 may also be configured to maintain acoustic limits and/or maintain acoustic preferences for sound generated by air mover 108, for example, as described in U.S. patent application Ser. No. 16/852,118, filed Apr. 17, 2020, and entitled "Systems and Methods for Acoustic Limits of Thermal Control System in an Information Handling System," which is incorporated by reference herein in its entirety.

Additionally, thermal control system 114 may also be configured to receive one or more signals indicative of an airflow within information handling system 102 (e.g., one or more signals from one or more airflow sensors 120) and based on such one or more signals, determine whether to communicate an alert to a user (e.g., administrator or end user) of information handling system 102 that an air filter of information handling system 102 has exceeded a threshold for servicing (e.g., cleaning or replacing) the air filter. Such functionality is described in greater detail below with respect to FIGS. 3 and 4.

In some embodiments, thermal control system 114 may include a program of instructions (e.g., software, firmware) configured to, when executed by a processor or controller integral to management controller 112, carry out the functionality of thermal control system 114.

Temperature sensor 118 may comprise any system, device, or apparatus (e.g., a thermometer, thermistor, etc.) configured to communicate a signal to thermal control system 114 indicative of a temperature within information handling system 102.

Airflow sensor 120 may comprise any system, device, or apparatus configured to communicate a signal to thermal control system 114 indicative of an airflow within information handling system 102. Airflow sensor 120 may be implemented in any suitable manner.

In addition to processor 103, memory 104, air mover 108, management controller 112, temperature sensor 118, and airflow sensor 120, information handling system 102 may include one or more other information handling resources. In addition, for the sake of clarity and exposition of the present disclosure, FIG. 1 depicts only one air mover 108 and temperature sensor 118. In embodiments of the present disclosure, information handling system 102 may include any number of air movers 108 and temperature sensors 118.

Figure 2:
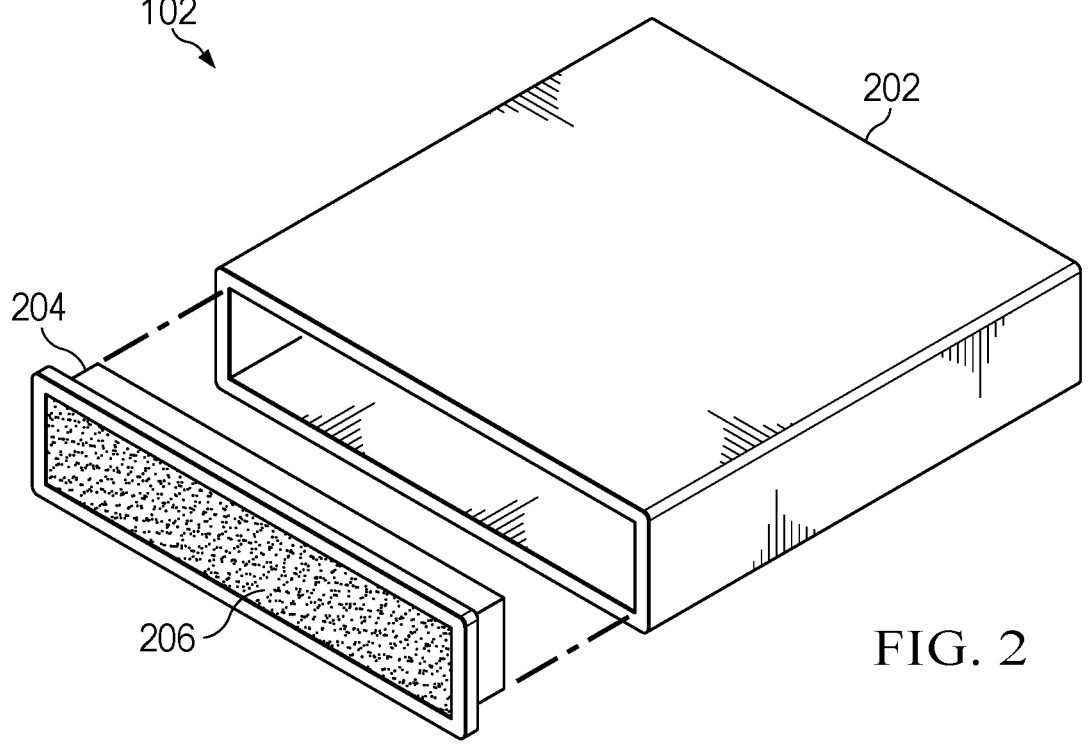
FIG. 2 illustrates an isometric view of selected components of an example information handling system, in accordance with embodiments of the present disclosure.

FIG. 2 illustrates an isometric view of selected components of information handling system 102, in accordance with embodiments of the present disclosure. As shown in FIG. 2, information handling system 102 may comprise (in addition to those components described with reference to FIG. 1) a chassis 202, a bezel 204, and an air filter 206.

Chassis 202 may comprise any suitable housing or enclosure for housing various components of information handling system 102, including without limitation those components depicted in FIG. 1. Accordingly, chassis 202 may be constructed from plastic, metal, and/or other suitable materials.

Bezel 204 may comprise a mechanical member configured to couple to a side or edge of chassis 202. In some embodiments, bezel 204 may effectively operate as a removable cover that may be removed to provide access to components internal to chassis 202.

Air filter 206 may be integrated within bezel 204 and may comprise any system, device, or apparatus configured to collect particulate matter in airflow driven through bezel 204, to prevent such particulate matter from entering the internal space of chassis 202. In some embodiments, air filter 206 may be configured as a replaceable filter that may be removed and replaced with a similar or identical air filter when air filter 206 becomes substantially degraded by collected particulate matter. In these and other embodiments, air filter 206 may be configured to be reusable after cleaning.

In addition to chassis 202, bezel 204, and air filter 206, information handling system 102 may include one or more other components or information handling resources.

FIG. 3 illustrates a flow chart of an example method 300 for applying a self-calculating filter fouling threshold, in accordance with embodiments of the present disclosure. According to one embodiment, method 300 may begin at step 302. As noted above, teachings of the present disclosure may be implemented in a variety of configurations of information handling system 102 and/or thermal control system 114. As such, the preferred initialization point for method 300 and the order of the steps comprising method 300 may depend on the implementation chosen.

At step 302, a user (e.g., administrator or end user) of information handling system 102 may install a clean air filter 206 in information handling system 102.

At step 304, thermal control system 114 may determine that a clean air filter 206 has been installed. For example, in some embodiments, such determination may be made in response to the user indicating to thermal control system 114 (e.g., via management interface of management controller 112) that a clean filter has been installed. As another example, in these and other embodiments, thermal control system 114 may be able to detect the presence of a clean filter based on historical data from airflow sensor 120 (e.g., airflow detected by airflow sensor 120 at a given speed of air mover 108 may increase significantly after a fouled air filter 206 is replaced with a clean air filter 206).

At step 306, in order to obtain a clean filter baseline airflow reading, thermal control system 114 may set a speed of air mover 108 to a predetermined filter testing speed. In some embodiments, to provide for maximum measurement sensitivity, the predetermined filter testing speed may be 100% of the maximum speed of air mover 108.

At step 308, thermal control system 114 may obtain a measurement from airflow sensor 120 of an airflow flowing in information handling system 102 in response to the predetermined filter testing speed, to determine the clean filter baseline airflow.

At step 310, thermal control system 114 may calculate a threshold filter failure airflow based on the clean filter baseline airflow. For example, in some embodiments, the threshold filter failure airflow may be calculated as a predetermined percentage of the clean filter baseline airflow. In such embodiments, such predetermined percentage may be based on the particular hardware configuration of information handling system 102.

At step 312, thermal control system 114 may periodically (e.g., daily, weekly, etc.) execute filter fouling tests in which thermal control system 114 sets the speed of air mover 108 to the predetermined filter testing speed, determines the airflow measured by airflow sensor 120 responsive to the predetermined filter testing speed, and compares such measured airflow to the threshold filter failure airflow. If the measured airflow is less than the threshold filter failure airflow, thermal control system 114 may generate an alert (e.g., to a management interface of management controller 112) indicating that the user should service (e.g., clean and/or replace) air filter 206.

Notably, a failure of one or more air movers 108 in an array of air movers 108 may lead to a false positive indication of measured airflow being less than the threshold filter failure airflow during a periodic filter fouling test. Accordingly, in such scenarios, thermal control system 114 may refrain from communicating alerts indicative of a needed filter servicing. Alternatively in such scenarios, thermal control system 114 may communicate an alert recommending replacement of the one or more failed air movers 108, then execute a filter fouling test after such replacement of air movers 108.

After completion of step 312, method 300 may end.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using information handling system 102, thermal control system 114, or any other system operable to implement method 300. In certain embodiments, method 300 may be implemented partially or fully in software and/or firmware embodied in computer-readable media.

Despite the advantages of the approach of method 300, one disadvantage of such approach and many other existing approaches to detecting filter degradation is that such approaches may employ large air mover speeds (e.g., 100% of maximum air mover speed) for filter testing. However, ramping of an air mover speed from a relatively low speed to 100% of its maximum speed may have negative effects, including without limitation: alerting nearby technicians to a possibility of a problem with an information handling system, being too loud or otherwise acoustically undesirable to people nearby, and/or causing a regular, sudden power increase to a data center if multiple information handling systems perform filter tests contemporaneously. Such disadvantages may be reduced or eliminated through use of the approach described in method 400, below.

Figure 4:
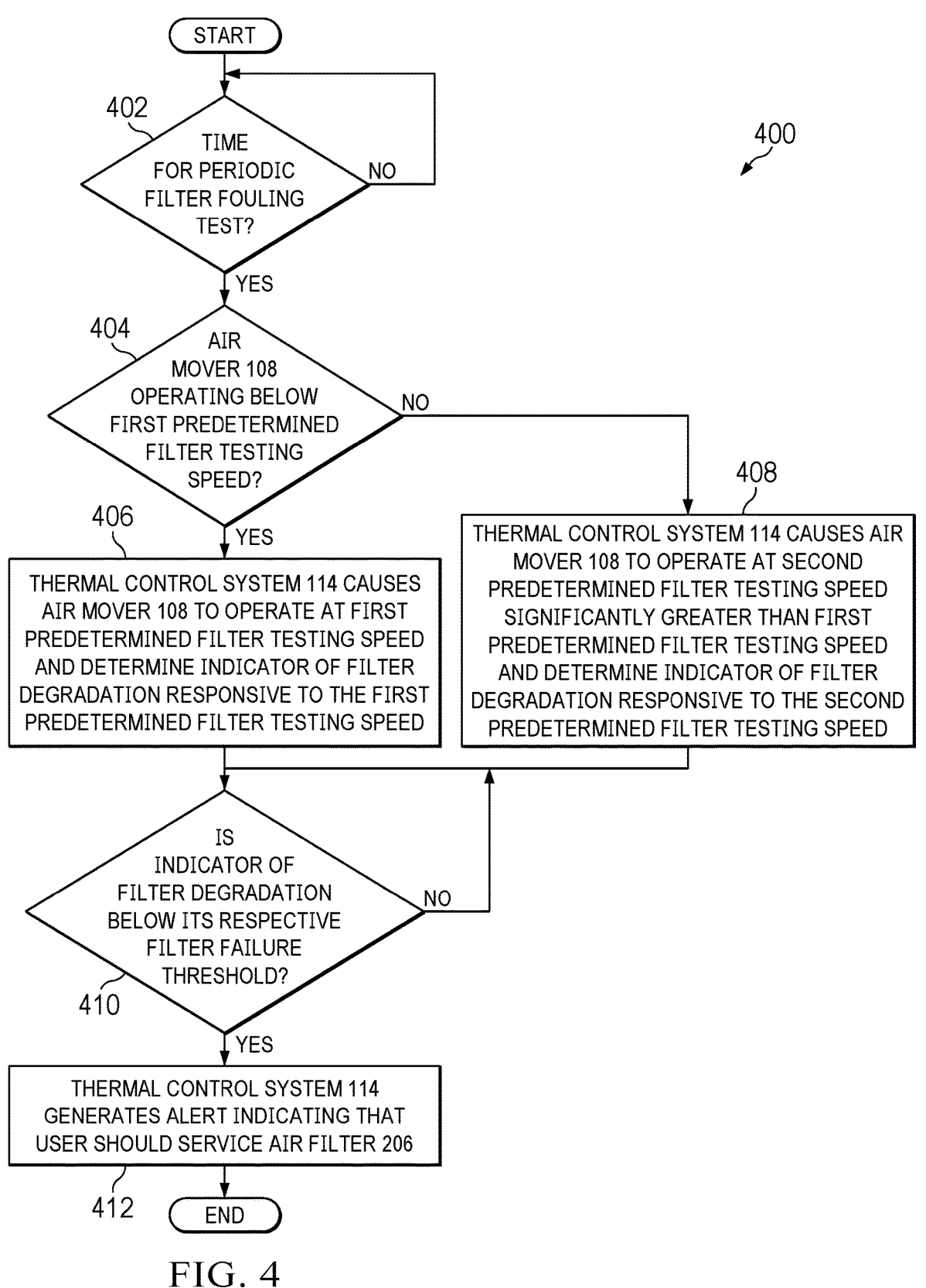
FIG. 4 illustrates a flow chart of an example method for applying filter fouling thresholds for a plurality of air mover speeds, in accordance with embodiments of the present disclosure.

FIG. 4 illustrates a flow chart of an example method for applying filter fouling thresholds for a plurality of air mover speeds, in accordance with embodiments of the present disclosure. According to one embodiment, method 400 may begin at step 402. As noted above, teachings of the present disclosure may be implemented in a variety of configurations of information handling system 102 and/or thermal control system 114. As such, the preferred initialization point for method 400 and the order of the steps comprising method 400 may depend on the implementation chosen.

At step 402, thermal control system 114 may determine whether it is time for a periodic filter fouling test. If time has passed for executing a periodic filter fouling test, method 400 may proceed to step 404. Otherwise, method 400 may remain at step 402 until it is time to conduct a periodic filter fouling test.

At step 404, thermal control system 114 may determine whether air mover 108 is operating below a first predetermined filter testing speed (e.g., 50% of maximum speed of air mover 108). If air mover 108 is operating below the first predetermined filter testing speed, method 400 may proceed to step 406. Otherwise, method 400 may proceed to step 408.

At step 406, responsive to air mover 108 operating below the first predetermined filter testing speed, thermal control system 114 may cause air mover 108 to operate at the first predetermined filter testing speed and determine an indicator of filter degradation responsive to the first predetermined filter testing speed. In some embodiments, such indicator may be an airflow reading measured by airflow sensor 120. In other embodiments, such indicator may be another known indicator of filter degradation, such as a pressure differential between the interior and exterior of chassis 202. After completion of step 406, method 400 may proceed to step 410.

At step 408, responsive to air mover 108 operating above the first predetermined filter testing speed, thermal control system 114 may cause air mover 108 to operate at a second predetermined filter testing speed (e.g., 100% of maximum speed of air mover 108) significantly greater than the first predetermined filter testing speed and determine an indicator of filter degradation responsive to the second predetermined filter testing speed. In some embodiments, such indicator may be an airflow reading measured by airflow sensor 120. In other embodiments, such indicator may be another known indicator of filter degradation, such as a pressure differential between the interior and exterior of chassis 202.

At step 410, thermal control system 114 may compare the indicator of filter degradation at either of steps 406 or 408 to a filter failure threshold associated with the predetermined filter testing speed used. In other words, thermal control system 114 may apply a first filter failure threshold to testing at the first predetermined filter testing speed and apply a second filter failure threshold to testing at the second predetermined filter testing speed. If the indicator of filter degradation measured at step 406 or 408 is below its respective filter failure threshold, method 400 may proceed to step 412. Otherwise, method 400 may proceed again to step 402.

In some embodiments, each of the first filter failure threshold and the second filter failure threshold may be determined in a manner similar to that of method 300, described above. However, in other embodiments, such first filter failure threshold and second filter failure threshold may be determined in other ways, and in some instances may be fixed, predetermined values.

At step 412, responsive to the indicator that filter degradation is below its respective filter failure threshold, thermal control system 114 may generate an alert (e.g., to a management interface of management controller 112) indicating that the user should service (e.g., clean and/or replace) air filter 206. After completion of step 412, method 400 may end.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using information handling system 102, thermal control system 114, or any other system operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
a component;
a cooling fan or blower configured to drive air to cool the component; and
a controller coupled to the cooling fan or blower and configured to:
detect, based on historical airflow data obtained from an airflow sensor, an indication of an air filter installation;
set a speed of the cooling fan or blower to a first predetermined speed and obtain an initial value of airflow;
periodically perform air filter test operations to test the air filter, wherein the air filter test operations include:
detecting a speed of the cooling fan or blower below the first predetermined speed, increasing the speed to the first predetermined speed and obtaining an indicator of filter degradation corresponding to the first predetermined speed;
detecting the cooling fan or blower operating above the first predetermined speed, increasing the speed to a second predetermined speed, greater than the first predetermined speed, and obtaining an indicator of filter degradation corresponding to the second predetermined speed;

determining the indicator of filter degradation is below a filter failure threshold and communication an alert; and
wherein the indicator of filter degradation is a measured airflow in the information handling system.

2. The information handling system of claim 1, wherein the first predetermined speed is 50% of a specified speed of the cooling fan or blower.

3. The information handling system of claim 1, wherein the second predetermined speed is 100% of a specified speed of the cooling fan or blower.

4. A method comprising:
responsive to detecting installation of a clean air filter:
detecting, based on historical airflow data obtained from an airflow sensor, an indication of an air filter installation;
setting a speed of the cooling fan or blower to a first predetermined speed and obtain an initial value of airflow;
periodically performing air filter test operations to test the air filter, wherein the air filter test operations include:
detecting a speed of the cooling fan or blower below the first predetermined speed, increasing the speed to the first predetermined speed and obtaining an indicator of filter degradation corresponding to the first predetermined speed;
detecting the cooling fan or blower operating above the first predetermined speed, increasing the speed to a second predetermined speed, greater than the first predetermined speed, and obtaining an indicator of filter degradation corresponding to the second predetermined speed;
determining the indicator of filter degradation is below a filter failure threshold and communication an alert; and
wherein the indicator of filter degradation is a measured airflow in the information handling system.

5. The method of claim 4, wherein the first predetermined speed is 50% of a specified speed of the cooling fan or blower.

6. The method of claim 4, wherein the second predetermined speed is 100% of a specified speed of the cooling fan or blower.

7. An article of manufacture comprising:
a non-transitory computer-readable medium; and
computer-executable instructions carried on the computer-readable medium, the instructions readable by a processing device, the instructions, when read and executed, for causing the processing device to:
detect, based on historical airflow data obtained from an airflow sensor, an indication of an air filter installation;
set a speed of the cooling fan or blower to a first predetermined speed and obtain an initial value of airflow;
periodically perform air filter test operations to test the air filter, wherein the air filter test operations include:
detecting a speed of the cooling fan or blower below the first predetermined speed, increasing the speed to the first predetermined speed and obtaining an indicator of filter degradation corresponding to the first predetermined speed;
detecting the cooling fan or blower operating above the first predetermined speed, increasing the speed to a second predetermined speed, greater than the first predetermined speed, and obtaining an indicator of filter degradation corresponding to the second predetermined speed;
determining the indicator of filter degradation is below a filter failure threshold and communication an alert; and wherein the indicator of filter degradation is a measured airflow in the information handling system.

8. The article of claim 7, wherein the first predetermined speed is 50% of a specified speed of the cooling fan or blower.

9. The article of claim 7, wherein the second predetermined speed is 100% of a specified speed of the cooling fan or blower.

\* \* \* \* \*